US008435376B2

(12) United States Patent
Kim et al.

(10) Patent No.: US 8,435,376 B2
(45) Date of Patent: May 7, 2013

(54) CARRIER FOR MANUFACTURING SUBSTRATE AND METHOD OF MANUFACTURING SUBSTRATE USING THE SAME

(75) Inventors: Jin Ho Kim, Gyunggi-do (KR); Jin Yong Ahn, Gyunggi-do (KR); Ki Hwan Kim, Gyunggi-do (KR); Byung Moon Kim, Gyunggi-do (KR); Seok Kyu Lee, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 205 days.

(21) Appl. No.: 12/787,300

(22) Filed: May 25, 2010

(65) Prior Publication Data

US 2011/0159282 A1    Jun. 30, 2011

(30) Foreign Application Priority Data

Dec. 30, 2009   (KR) ........................ 10-2009-0133970

(51) Int. Cl.
*B29C 65/02* (2006.01)
*B29C 65/52* (2006.01)
*B29C 63/26* (2006.01)
*B32B 37/26* (2006.01)
*B32B 38/10* (2006.01)

(52) U.S. Cl.
USPC ............................ 156/247; 156/289; 156/709

(58) Field of Classification Search .................. 156/247, 156/248, 250, 267, 273.9, 275.7, 278, 289, 156/709

See application file for complete search history.

(56) References Cited

U.S. PATENT DOCUMENTS

| 8,101,864 B2 * | 1/2012 | Chinda et al. ................. 174/255 |
| 8,196,293 B2 * | 6/2012 | Ko ................................... 29/830 |
| 2010/0288549 A1 * | 11/2010 | Chiang et al. ................. 174/261 |
| 2011/0079349 A1 * | 4/2011 | Cho et al. ....................... 156/247 |

FOREIGN PATENT DOCUMENTS

| JP | 2006-196925 | 7/2006 |
| JP | 2009-032918 | 2/2009 |
| TW | 200803682 | 1/2008 |
| TW | 200920207 | 5/2009 |

OTHER PUBLICATIONS

Office Action from counterpart Korean Patent Application No. 10-2009-0133970, mailed Jun. 8, 2011, 4 pages.
Office Action from counterpart Taiwanese Patent Application No. 099117225, mailed Sep. 25, 2012, 11 pages, English Summary included.

* cited by examiner

*Primary Examiner* — Sing P Chan
(74) *Attorney, Agent, or Firm* — Blakely Sokoloff Taylor & Zafman LLP

(57) ABSTRACT

Disclosed herein is a carrier for manufacturing a substrate, including: a base plate; adhesive layers formed on one side or both sides of the base plate; auxiliary adhesive layers, each of which is buried in one side of each of the adhesive layers, has a smaller area than each of the adhesive layers and has lower adhesivity than each of the adhesive layers; and metal layers, each of which is formed on one side of each of the auxiliary adhesive layers, whose edges are attached to the adhesive layers, and whose other portions excluding the edges are attached to the auxiliary adhesive layers. The carrier is advantageous in that a metal layer and an auxiliary adhesive layer are attached to each other by the adhesivity of the auxiliary adhesive layer, so that it is not required to use vacuum adsorption, with the result that a process of manufacturing a substrate can be performed more stably.

5 Claims, 6 Drawing Sheets

CARRIER FOR MANUFACTURING SUBSTRATE AND METHOD OF MANUFACTURING SUBSTRATE USING THE SAME

CROSS REFERENCE TO RELATED APPLICATION

This application claims the benefit of Korean Patent Application No. 10-2009-0133970, filed Dec. 30, 2009, entitled "A carrier member for manufacturing a substrate and a method of manufacturing a substrate using the same", which is hereby incorporated by reference in its entirety into this application.

BACKGROUND OF THE INVENTION

1. Technical Field

The present invention relates to a carrier for manufacturing a substrate and a method of manufacturing a substrate using the same.

2. Description of the Related Art

Generally, printed circuit boards (PCBs) are manufactured by patterning one or both sides of a substrate, composed of various thermosetting resins, using copper foil, and disposing and fixing ICs or electronic parts on the substrate to form an electric circuit and then coating the substrate with an insulator.

Recently, with the advancement of the electronics industry, electronic parts are increasingly required to be highly functionalized, light, thin, short and small. Thus, printed circuit boards loaded with such electronic parts are also required to be highly densified and thin.

In particular, in order to keep up with the thinning of printed circuit boards, a coreless substrate which can decrease thickness by removing a core and can shorten signal processing time is attracting considerable attention. However, a coreless substrate needs a carrier serving as a support during a process because it does not have a core. Hereinafter, a conventional method of manufacturing a coreless substrate will be described with reference to FIGS. 1A to 1E.

FIGS. 1A to 1E are sectional views sequentially showing a conventional method of manufacturing a substrate using a carrier, and FIG. 2 is an enlarged view showing an essential part of a first metal layer and a second metal layer shown in FIG. 1. Problems of conventional technologies will be described with reference to FIGS. 1A to 1E.

First, as shown in FIG. 1A, a carrier 10 is provided. The carrier 10 is fabricated by sequentially forming adhesive films 12, first metal layers 13 and second metal layers 14 on both sides of a copper clad laminate (CCL) 11. In this case, the carrier is heated and pressed by a press, and thus the copper clad laminate 11 and the second metal layer 14 attach to each other at a periphery thereof by means of the adhesive film 12. Meanwhile, in order to stably attach the copper clad laminate 11 and the second metal layer 14 to each other, the contact face therebetween must have a thickness of 10 mm, and the first metal layer 13 and the second metal layer 14 are vacuum-adsorbed.

Subsequently, as shown in FIG. 1B, build up layers 15 are formed on both sides of the carrier 10. Here, each of the build up layers 15 is formed in a general manner, and is additionally provided with a third metal layer 16 for preventing the warpage of the build up layer 15 at the outermost layer thereof.

Subsequently, as shown in FIG. 1C, the build up layers 15 are separated from the carrier 10. Here, the build up layers 15 are separated from the carrier 10 by removing the edge of the adhesive film through which the copper clad laminate 11 and the second metal layer 14 are attached to each other by a routing process.

Subsequently, as shown in FIG. 1D, the second metal layer 14 and the third metal layer 16 formed at the outermost layers of the build up layer 15 are removed by etching.

Subsequently, as shown in FIG. 1E, openings 17 for exposing pads 19 are formed in the outermost insulation layers of the build up layer 15, and then solder balls 18 are formed on the pads 19.

In the above-mentioned conventional method of manufacturing a substrate, copper foil is used as the first metal layer 13 and the second metal foil 14. However, the copper foil includes a matte surface (M surface) having high surface roughness and a shiny surface (S surface) having low surface roughness. Therefore, as shown in FIG. 2, small space (S) is formed between the first metal layer 13 and the second metal layer 14 due to the matte surface (M surface), and thus it is difficult to completely maintain a vacuum. Consequently, there is a problem in that wrinkles occur when the build up layer 15 is formed on the second metal layer 14.

Further, even when pin-holes are formed in the first metal layer 13 or the second metal layer 14, there is a problem in that a vacuum is not maintained between the first metal layer 13 and the second metal layer 14, and thus it is difficult to continue a process.

Furthermore, when the build up layers 15 are separated from the carrier 10 by removing the edge of the adhesive film 12 through a routing process, the build up layers 15 warp in an extreme manner due to the difference in material properties between the second metal layer 13 and the insulating material of the carrier 10. Therefore, there are problems in that process automation cannot be realized and in that subsequent processes must be manually performed.

SUMMARY OF THE INVENTION

Accordingly, the present invention has been made to solve the above-mentioned problems, and the present invention provides a carrier for manufacturing a substrate, which can completely maintain a vacuum by attaching an auxiliary adhesive layer to a metal layer, and which can prevent the warpage of a build up layer by maintaining the adhesion between the auxiliary adhesive layer and the metal layer for a predetermined time using the adhesivity of the auxiliary adhesive layer even after a routing process, and a method of manufacturing a substrate using the same.

An aspect of the present invention provides a carrier for manufacturing a substrate, including: a base plate; adhesive layers formed on one side or both sides of the base plate; auxiliary adhesive layers, each of which is buried in one side of each of the adhesive layers, has a smaller area than each of the adhesive layers and has lower adhesivity than each of the adhesive layers; and metal layers, each of which is formed on one side of each of the auxiliary adhesive layers, whose edges are attached to the adhesive layers, and whose other portions excluding the edges are attached to the auxiliary adhesive layers.

Here, the adhesive layer may be prepreg, an ajinomoto build up film (ABF) or an epoxy film.

Further, the auxiliary adhesive layer may be a polymer film.

Further, the auxiliary adhesive layer may have an adhesivity of 0.01~0.2 KN/m.

Further, the adhesivity of one side of the auxiliary adhesive layer may be lower than that of the other side of the auxiliary adhesive layer.

Another aspect of the present invention provides a method of manufacturing a substrate using a carrier, including: forming an adhesive layer on one side or both sides of a base plate; forming an auxiliary adhesive layer on the adhesive layer, the auxiliary adhesive layer having lower adhesivity and a smaller area than the adhesive layer; applying a metal layer onto one side of the auxiliary adhesive layer and then heating and pressing the metal layer to bury the auxiliary adhesive layer in one side of the adhesive layer, and then attaching the edge of the metal layer to the adhesive layer and attaching the other portion of the metal layer, excluding the edge thereof, to the auxiliary adhesive layer to provide a carrier for manufacturing a substrate; and forming a build up layer on one side of the metal layer and then removing the edge of the metal layer attached to the adhesive layer to separate the metal layer from the auxiliary adhesive layer.

Here, in the separating of the metal layer from the auxiliary adhesive layer, the adhesion between the metal layer and the auxiliary adhesive layer may be maintained for a predetermined time due to the adhesivity of the auxiliary adhesive layer after the edge of the metal layer has been removed.

Further, in the separating of the metal layer from the auxiliary adhesive layer, the metal layer may be separated from the auxiliary adhesive layer by warping the metal layer after the edge of the metal layer has been removed.

Further, in the forming of the adhesive layer, the adhesive layer may be prepreg, an ajinomoto build up film (ABF) or an epoxy film.

Further, in the forming of the auxiliary adhesive layer, the auxiliary adhesive layer may be a polymer film.

Further, in the forming of the auxiliary adhesive layer, the auxiliary adhesive layer may have an adhesivity of 0.01~0.2 KN/m.

Further, in the applying of the metal layer onto the auxiliary adhesive layer, the adhesivity of one side of the auxiliary adhesive layer may be lower than that of the other side of the auxiliary adhesive layer.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
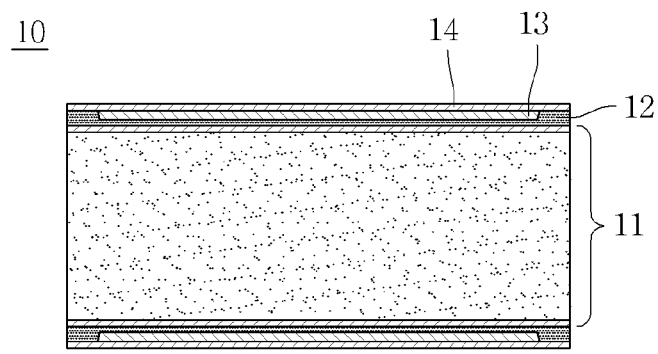
FIGS. 1A to 1E are sectional views sequentially showing a conventional method of manufacturing a substrate using a carrier.
Figure 1B:
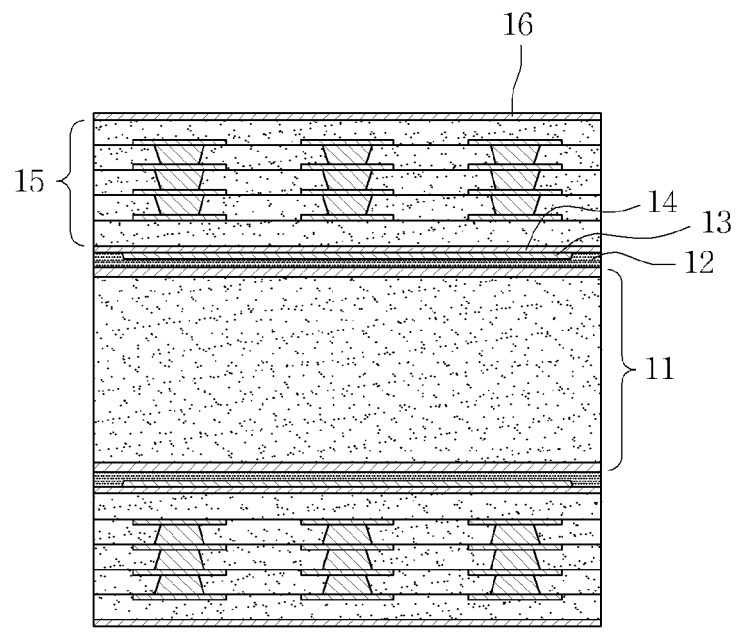
Figure 1C:
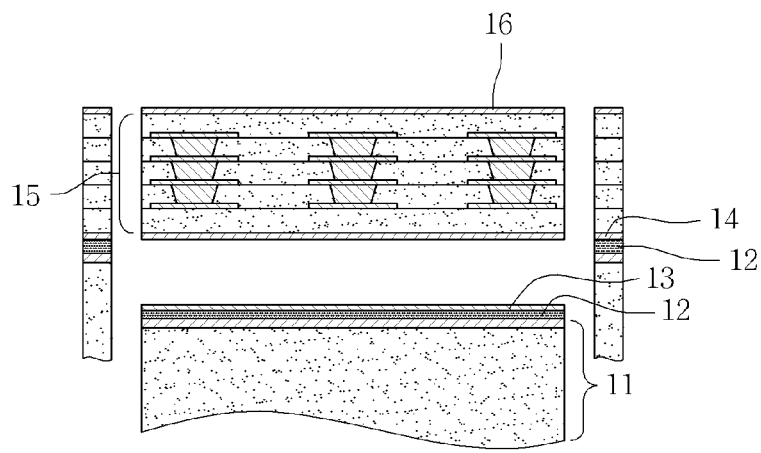
Figure 1D:
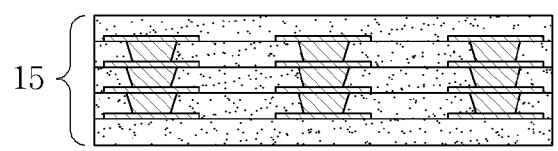
Figure 1E:
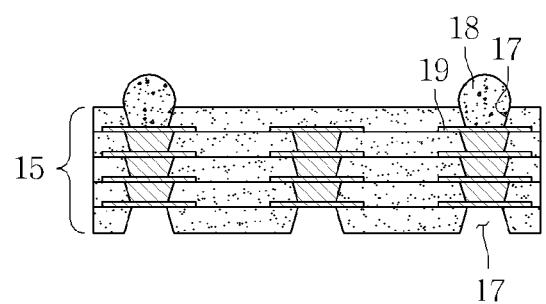
Figure 2:
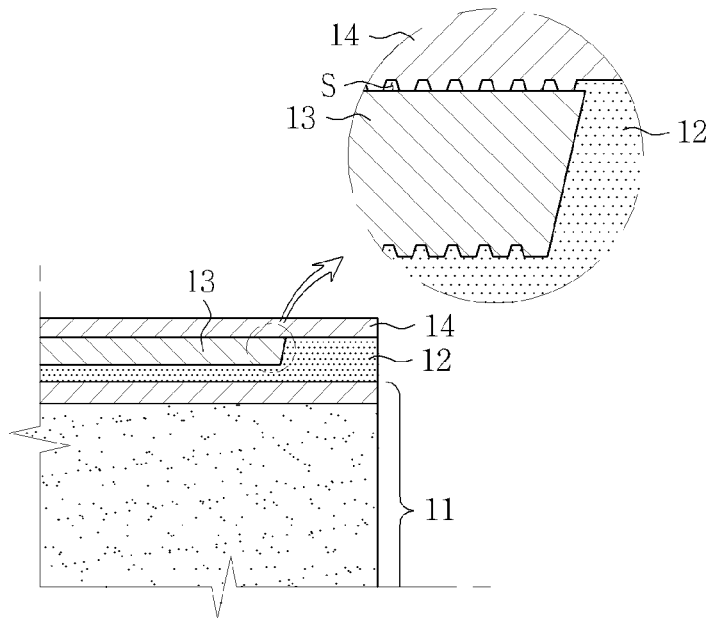
FIG. 2 is an enlarged view showing an essential part of a first metal layer and a second metal layer shown in FIG. 1.

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. Further, in the following description, the terms "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 3:
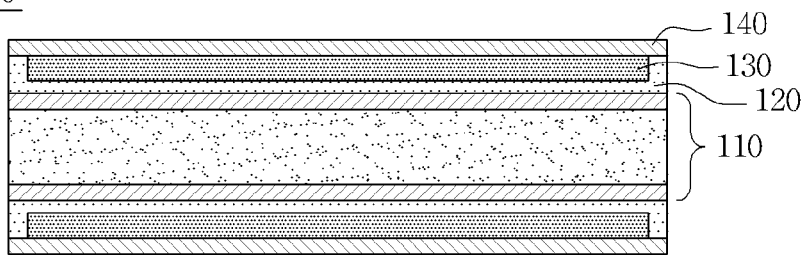
FIG. 3 is a sectional view showing a carrier for manufacturing a substrate according to an embodiment of the present invention.

FIG. 3 is a sectional view showing a carrier for manufacturing a substrate according to an embodiment of the present invention.

As shown in FIG. 3, the carrier 100 for manufacturing a substrate according to this embodiment includes: a base plate 110; adhesive layers 120 formed on one side or both sides of the base plate 110; auxiliary adhesive layers 130, each of which is buried in one side of each of the adhesive layers 120, has a smaller area than each of the adhesive layers 120 and has lower adhesivity than each of the adhesive layers 120; and metal layers 140, each of which is formed on one side of each of the auxiliary adhesive layers 130, whose edges are attached to the adhesive layers 120, and whose other portions excluding the edges are attached to the auxiliary adhesive layers 130.

The adhesive layers 120, which serve to attach and fix the metal layers 140, are formed on both sides of the base plate 110. In the drawings, the adhesive layers 120 are formed on both sides of the base plate 110, but the present invention is not limited thereto, and the adhesive layer 120 may be formed on one side of the base plate 110. Further, since the adhesive layer 120 must be attached to the metal layer 140, it may be formed of prepreg, an ajinomoto build up film (ABF), an epoxy film or the like, which has at least a predetermined adhesivity.

Meanwhile, the kind of the base plate 110 is not particularly limited. A copper clad laminate (CCL), a prepreg coated on both sides thereof with copper foil or the like may be used as the base plate 110.

The auxiliary adhesive layer 130, which serves to maintain the adhesion between the adhesive layer 120 and the metal layer 140 even after the adhesive layer 120 and the metal layer 140 are detached from each other by removing the edge of the adhesive layer 120, is buried in the one side of the adhesive layer 120. The auxiliary adhesive layer 130 must not be buried in the entire region of the adhesive layer 120. The auxiliary adhesive layer 130 must be formed such that it has a smaller area than the adhesive layer 120, and must be buried in the partial region of the adhesive layer 120 such that the edge of the adhesive layer 120 is brought into contact with the edge of the metal layer 140. Since the auxiliary adhesive layer 130 is attached to the metal layer 140 by its adhesivity, the present invention, differently from conventional technologies, does not employ vacuum adsorption. However, since the metal layer 140 must be finally detached from the auxiliary adhesive layer 130, the auxiliary adhesive layer 130 must have lower adhesivity than the adhesive layer 120, and the metal layer 140 must be separated from the auxiliary adhesive layer 130 by performing an additional separation process or warping the metal layer 140 (refer to FIGS. 8 to 9). Therefore, the auxiliary adhesive layer 130 may have an adhesivity of 0.01~0.2 KN/m, but the present invention is not limited thereto.

Further, in order to finally separate the metal layer 140 from the auxiliary adhesive layer 130, the bonding force between the auxiliary adhesive layer 130 and the metal layer 140 must be weaker than the bonding force between the auxiliary adhesive layer 130 and the adhesive layer 120. Therefore, it is preferred that the adhesivity of one side of the auxiliary adhesive layer 130 (the one side thereof is brought into contact with the metal layer 140) be lower than the adhesivity of the other side of the auxiliary adhesive layer 130 (the other side thereof is brought into contact with the adhesive layer 120).

Considering the ease of the control of the bonding force and the realization of the difference in adhesivity between one side and the other side of the auxiliary adhesive layer 130, it is preferred that a polymer film be employed as the auxiliary adhesive layer 130.

The metal layer 140, which serves as a release layer for separating a build up layer 150 from the adhesive layer 120 and the auxiliary adhesive layer 130, is formed on one side of the auxiliary adhesive layer 130. As described above, since the auxiliary adhesive layer 130 is formed such that it has a smaller area than the adhesive layer 120, the edge of the adhesive layer 120 is exposed. Therefore, when the metal layer 140 is formed on the auxiliary adhesive layer 130 and then heated and pressed, the edge of the metal layer 140 is attached to the edge of the adhesive layer 120, and the other portion of the metal layer, excluding the edge thereof, is attached to the auxiliary adhesive layer 130. Meanwhile, the metal layer 140 may be made of copper (Cu), nickel (Ni) or aluminum (A), which can be easily etched, because the metal layer 140 must be separated from a carrier 100 together with a build up layer 150 and then removed from the build up layer 150 (refer to FIG. 10). For example, copper foil may be used as the metal layer 140.

The carrier 100 according to this embodiment, differently from conventional carriers, is advantageous in that the metal layer 140 and the auxiliary adhesive layer 130 are attached to each other by the adhesivity of the auxiliary adhesive layer 130, so that it is not required to use vacuum adsorption, with the result that a process of manufacturing a substrate can be more stably performed.

Further, the carrier 100 according to this embodiment is advantageous in that the warpage of the build up layer 150 can be prevented by maintaining the adhesion between the auxiliary adhesive layer 130 and the metal layer 140 using the adhesivity of the auxiliary adhesive layer 130 even after a routing process for the adhesive layer 120, thus realizing process automation.

FIGS. 4 to 11 are sectional views sequentially showing a method of manufacturing a substrate using the carrier according to an embodiment of the present invention.

As shown in FIGS. 4 to 11, the method of manufacturing a substrate using the carrier 100 according to this embodiment includes: forming an adhesive layer 120 on one side or both sides of a base plate 110; forming an auxiliary adhesive layer 130 on the adhesive layer 120, the auxiliary adhesive layer 130 having lower adhesivity and a smaller area than the adhesive layer 120; applying a metal layer 140 onto one side of the auxiliary adhesive layer 130 and then heating and pressing the metal layer 140 to bury the auxiliary adhesive layer 130 in one side of the adhesive layer 120, and then attaching the edge of the metal layer 140 to the adhesive layer 120 and attaching the other portion of the metal layer 140, excluding the edge thereof, to the auxiliary adhesive layer 130 to provide a carrier 100 for manufacturing a substrate; and forming a build up layer 150 on one side of the metal layer 140 and then removing the edge of the metal layer 140 attached to the adhesive layer 120 to separate the metal layer 140 from the auxiliary adhesive layer 130.

Figure 4:
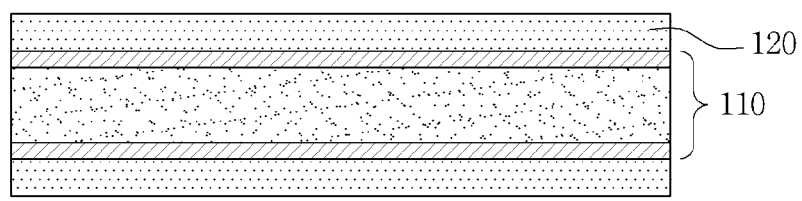
FIGS. 4 to 11 are sectional views sequentially showing a method of manufacturing a substrate using the carrier according to an embodiment of the present invention.

First, as shown in FIG. 4, an adhesive layer 120 is formed on a base plate 110. Here, since the adhesive layer 120 serves to attach and fix a metal layer 140 in subsequent processes, it may be formed of prepreg, an ajinomoto build up film (ABF), an epoxy film or the like, which has predetermined adhesivity or more. In the drawings, the adhesive layers 120 are formed on both sides of the base plate 110, but the present invention is not limited thereto, and the adhesive layer 120 may be formed on one side of the base plate 110. When the adhesive layer 120 is formed only on one side of the base plate 110, an auxiliary adhesive layer 130, a metal layer 140 and a build up layer are also sequentially formed only on one side of the base plate 110.

Figure 5:
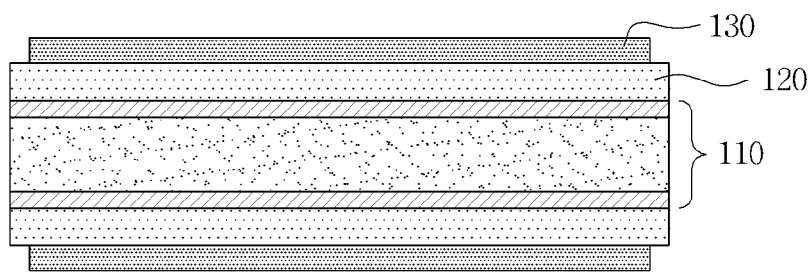

Subsequently, as shown in FIG. 5, an auxiliary adhesive layer 130 is formed on one side of the adhesive layer 120. Here, the auxiliary adhesive layer 130 serves to maintain the adhesion between the adhesive layer 120 and the metal layer 140 even after the edge of the adhesive layer 120 has been removed in subsequent processes. Further, the auxiliary adhesive layer 130 may have a smaller area than the adhesive layer 120 such that the edge of the adhesive layer 120 is brought into contact with the edge of the metal layer 140. Meanwhile, the auxiliary adhesive layer 130 must have lower adhesivity than the adhesive layer 120 because it must be finally detached from the metal layer 140. Therefore, the auxiliary adhesive layer 130 may have an adhesivity of 0.01~0.2 KN/m, but the present invention is not limited thereto.

Further, in order to finally separate the auxiliary adhesive layer 130 and the metal layer 140 from each other, the bonding force between the auxiliary adhesive layer 130 and the metal layer 140 must be weaker than the bonding force between the auxiliary adhesive layer 130 and the adhesive layer 120. Therefore, it is preferred that the adhesivity of one side of the auxiliary adhesive layer 130 (the one side thereof is brought into contact with the metal layer 140) be lower than the adhesivity of the other side of the auxiliary adhesive layer 130 (the other side thereof is brought into contact with the adhesive layer 120).

Figure 6:
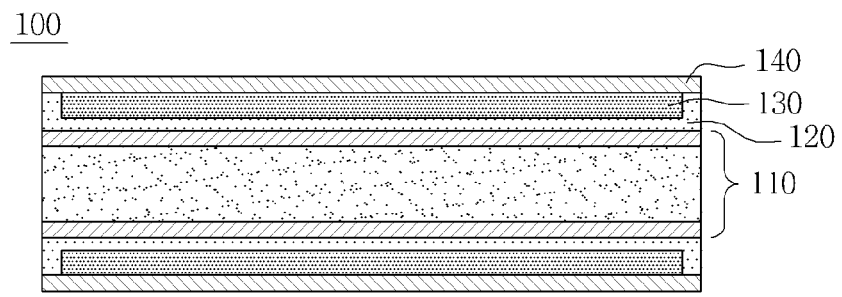

Subsequently, as shown in FIG. 6, a metal layer 140 is applied onto the auxiliary adhesive layer 130 to provide a carrier 100. Concretely, the metal layer 140 is applied onto one side of the auxiliary adhesive layer 130 and then heated and pressed to bury the auxiliary adhesive layer 130 in one side of the adhesive layer 120, and simultaneously the edge of the metal layer 140 is attached to the adhesive layer 120, and the other portion of the metal layer 140, excluding the edge thereof, is attached to the auxiliary adhesive layer 130. In this process, the metal layer 140 and the auxiliary adhesive layer 130 are attached to each other not by vacuum adsorption but by the adhesivity of the auxiliary adhesive layer 130, differently from conventional technologies.

Figure 7:
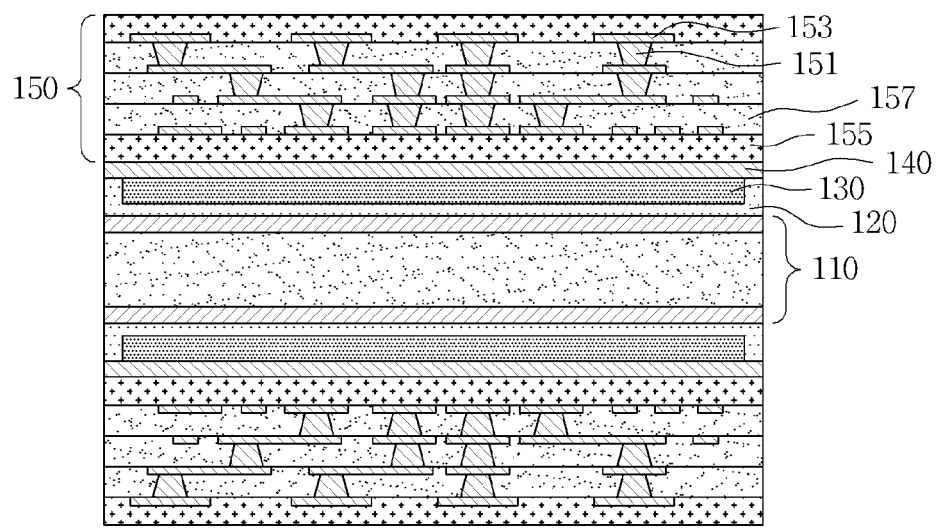

Subsequently, as shown in FIG. 7, a build up layer 150 is formed on one side of the metal layer 140. The build up layer 150 is formed by sequentially laminating a patterned circuit layer 153 and an insulating material 157 using plating or printing. Concretely, the build up layer 150 can be completed by applying an insulating material 151 onto the metal layer 140, forming via holes in the insulating material 157 using a YAG or $CO_2$ laser and then forming a circuit layer 153 including vias 151 on the insulating material 151 through a Semi-Additive Process (SAP) or a Modified Semi-Additive Process (MSAP). Further, the build up layer 150 may be provided with a solder resist layer 155 at the outermost layer. Here, the solder resist layer 155 is made of a heat-resistant coating material, and serves to protect the circuit layer 153 such that solder is not applied on the circuit layer 153 during soldering.

Meanwhile, in the drawings, the build up layers 150 are formed on both sides of a carrier 100, but the build up layer 150 may be formed only on one side of the carrier 100 by sequentially forming the adhesive layer 120, the auxiliary adhesive layer 130 and the metal layer 140 only on one side of the base plate 110 in the previous process.

Figure 8A:
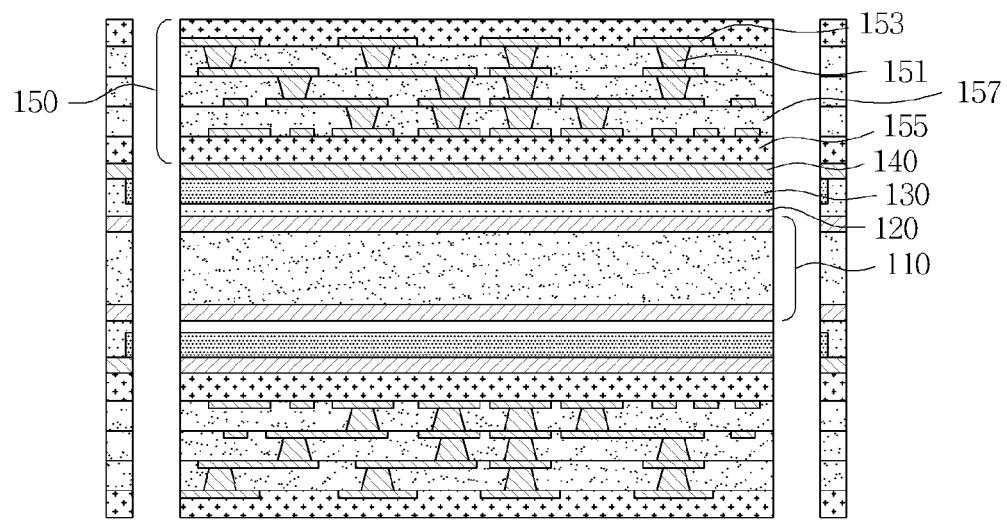
Figure 8B:
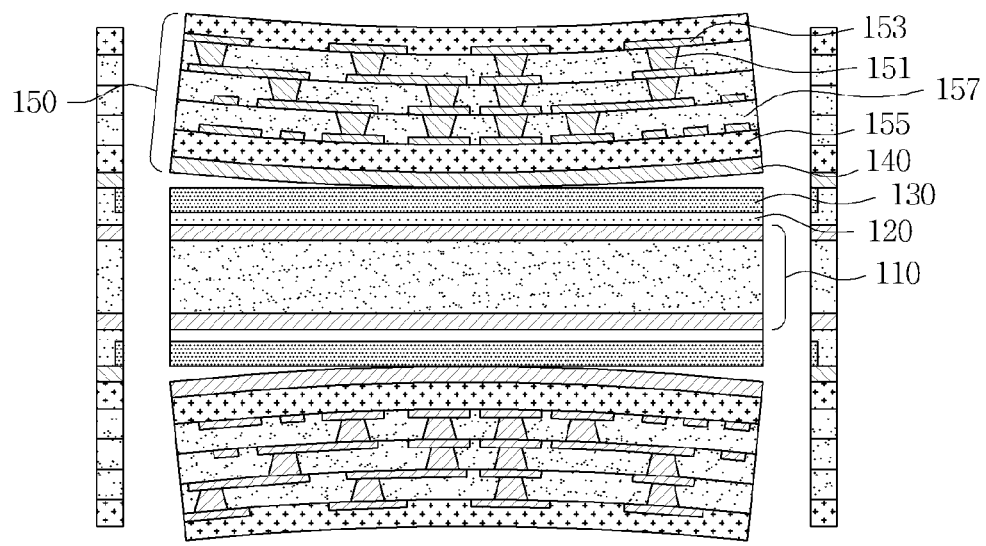
Figure 9:
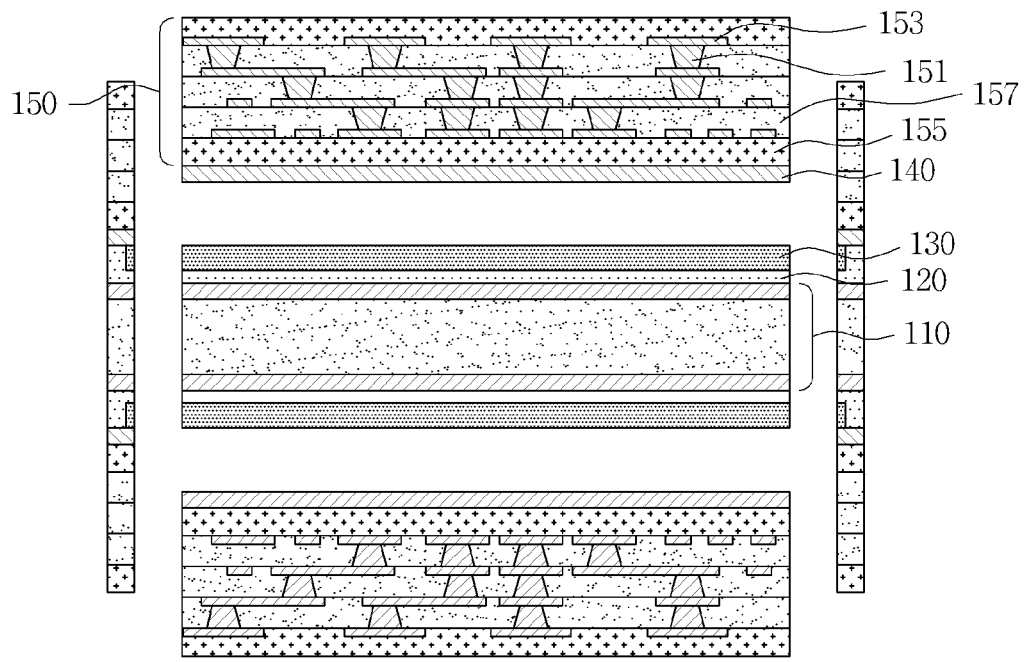

Subsequently, as shown in FIGS. 8 to 9, the edge of the metal layer 140 is removed to separate the metal layer 140 from the auxiliary adhesive layer 130. When the edge of the metal layer 140 attached to the edge of the adhesive layer 120 is removed, the bonding force between the adhesive layer 120 and the metal layer 140 disappears. However, since the other portion of the metal layer 140, excluding the edge thereof, is attached to the auxiliary adhesive layer 130, the metal layer 140 is not separated from the auxiliary adhesive layer 130 the moment the edge of the metal layer 140 is removed (refer to FIG. 8A). However, since the adhesivity of the auxiliary adhesive layer 130 decreases with the passage of time, the metal layer 140 can be separated from the auxiliary adhesive layer 130 after the predetermined time. In addition, the metal layer 140 may be separated from the auxiliary adhesive layer 130 by warping the metal layer 140 (refer to FIG. 8B) or by performing an additional separation process. In this process, since the metal layer 140 is not immediately separated from the auxiliary adhesive layer 130 and the adhesion between the metal layer 140 and the auxiliary adhesive layer 130 is maintained for a predetermined time due to the adhesivity of the auxiliary adhesive layer 130, the warpage of the build up layer 150 can be prevented, thus realizing process automation.

Figure 10:
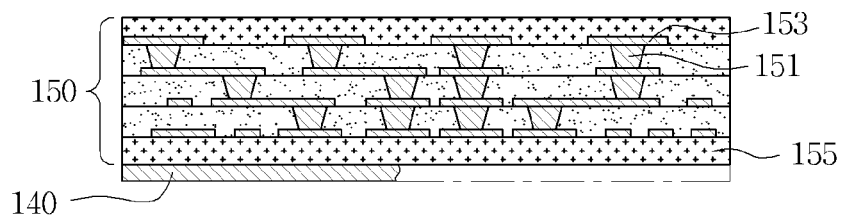
Figure 11:
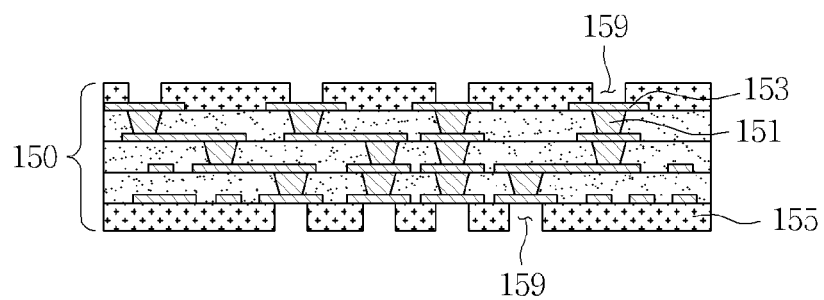

Subsequently, as shown in FIGS. 10 to 11, the metal layer 140 is removed from the build up layer 150, and then holes 159 are formed in the solder resist layer 155. Here, the metal layer 140 may be removed by etching, and the holes 159 are formed in the solder resist layer 155 in order to electrically connect the circuit layer 153 with external circuits. However, this process of forming the holes 159 in the solder resist layer 155 is not necessarily performed by an additional process.

As described above, according to the present invention, a metal layer and an auxiliary adhesive layer are attached to each other by the adhesivity of the auxiliary adhesive layer, so that it is not required to use vacuum adsorption, with the result that a process of manufacturing a substrate can be performed more stably.

Further, according to the present invention, the warpage of a build up layer can be prevented by maintaining the adhesion between the auxiliary adhesive layer and the metal layer using the adhesivity of the auxiliary adhesive layer even after a routing process for the adhesive layer, thus realizing process automation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A method of manufacturing a substrate using a carrier, comprising:
    forming an adhesive layer on at least one side of a base plate;
    forming an auxiliary adhesive layer on the adhesive layer, the auxiliary adhesive layer having lower adhesivity and a smaller area than the adhesive layer wherein the adhesivity of the side toward the adhesive layer is higher than the other side thereof;
    applying a metal layer onto one side of the auxiliary adhesive layer and then heating and pressing the metal layer to bury the auxiliary adhesive layer in one side of the adhesive layer, and then attaching the edge of the metal layer to the adhesive layer and attaching the other portion of the metal layer, excluding the edge thereof, to the auxiliary adhesive layer to provide a carrier for manufacturing a substrate; and
    forming a build up layer on one side of the metal layer and then removing the edge of the metal layer attached to the adhesive layer to separate the metal layer from the auxiliary adhesive layer, the auxiliary adhesive layer being in a state of attachment to the adhesive layer of the base substrate,
    wherein the metal layer is separated from the auxiliary adhesive layer by means of warping incurred in the metal layer after removing a border of the metal layer.

2. The method of manufacturing a substrate using a carrier according to claim 1, wherein, in the separating of the metal layer from the auxiliary adhesive layer, the adhesion between the metal layer and the auxiliary adhesive layer is maintained for a predetermined time due to the adhesivity of the auxiliary adhesive layer after the edge of the metal layer has been removed.

3. The method of manufacturing a substrate using a carrier according to claim 1, wherein, in the forming of the adhesive layer, the adhesive layer is prepreg, an ajinomoto build up film (ABF) or an epoxy film.

4. The method of manufacturing a substrate using a carrier according to claim 1, wherein, in the forming of the auxiliary adhesive layer, the auxiliary adhesive layer is a polymer film.

5. The method of manufacturing a substrate using a carrier according to claim 1, wherein, in the forming of the auxiliary adhesive layer, the auxiliary adhesive layer has an adhesivity of 0.01~0.2 KN/m.

* * * * *